(12) United States Patent
Ishikawa et al.

(10) Patent No.: US 6,797,588 B2
(45) Date of Patent: Sep. 28, 2004

(54) METHOD FOR MANUFACTURING A SEMICONDUCTOR DEVICE HAVING A TRENCH AND A THICK INSULATION FILM AT THE TRENCH OPENING

(75) Inventors: Eiji Ishikawa, Okazaki (JP); Takaaki Aoki, Nishikamo-gun (JP); Kenji Kondo, Hol-gun (JP)

(73) Assignee: Denso, Corporation, Kariya (JP)

( * ) Notice: Subject to any disclaimer, the term of this patent is extended or adjusted under 35 U.S.C. 154(b) by 0 days.

(21) Appl. No.: 10/108,443

(22) Filed: Mar. 29, 2002

(65) Prior Publication Data

US 2002/0140026 A1 Oct. 3, 2002

(30) Foreign Application Priority Data

Mar. 30, 2001 (JP) ........................................ 2001-101597

(51) Int. Cl.[7] .............................................. H01L 21/76
(52) U.S. Cl. .................... 438/426; 438/425; 438/443
(58) Field of Search ................................ 438/425, 426, 438/443, 270, 437, 589, FOR 192, 137, 138, 173, 192, 272, 430, 591, 595, 337, 348

(56) References Cited

U.S. PATENT DOCUMENTS

| | | | | |
|---|---|---|---|---|
| 5,082,795 A | * | 1/1992 | Temple | 438/138 |
| 5,330,927 A | * | 7/1994 | Lee | 438/238 |
| 5,447,883 A | | 9/1995 | Koyama | |
| 5,480,832 A | | 1/1996 | Miura et al. | |
| 5,541,425 A | | 7/1996 | Nishihara | |
| 5,648,283 A | * | 7/1997 | Tsang et al. | 438/138 |
| 6,259,143 B1 | * | 7/2001 | Tasaka | 257/390 |
| 6,448,139 B2 | | 9/2002 | Ito et al. | |
| 6,469,345 B2 | | 10/2002 | Aoki et al. | |
| 6,482,701 B1 | | 11/2002 | Ishikawa et al. | |
| 6,521,538 B2 | | 2/2003 | Soga et al. | |
| 2002/0167096 A1 | | 11/2002 | Aoki et al. | |

FOREIGN PATENT DOCUMENTS

| | | |
|---|---|---|
| JP | A-61-226966 | 10/1986 |
| JP | A-63-133665 | 6/1988 |
| JP | A-7-183400 | 7/1995 |
| JP | A-11-45935 | 2/1999 |

OTHER PUBLICATIONS

U.S. patent application Ser. No. 10/175,294, Aoki et al., filed Jun. 20, 2002.
U.S. patent application Ser. No. 09/630,786, Ishikawa et al., filed Aug. 2, 2000.
U.S. patent application Ser. No. 09/758,377, Aoki et al., filed Jan. 12, 2001.
U.S. patent application Ser. No. 09/790,888, Soga et al., filed Feb. 23, 2001.
U.S. patent application Ser. No. 09/875,026, Ito et al., filed Jun. 7, 2001.

* cited by examiner

*Primary Examiner*—George Fourson
*Assistant Examiner*—Thanh V Pham
(74) *Attorney, Agent, or Firm*—Posz & Bethards, PLC

(57) ABSTRACT

A surface of a semiconductor substrate is selectively etched to form a first opening, which serves as the opening of a trench. A USG film is deposited on the first opening. A second opening, the width of which is smaller than that of the first opening, is formed in the USG film within the first opening. An inner section of the trench is formed by etching while using the USG film as a mask. The inner surface of the inner region is thermally oxidized to form a silicon oxide film, and a gate insulating film is made by the silicon oxide film and the USG film. A gate electrode is formed in the trench. The gate insulating film is relatively thick at the opening of the trench, so the breakdown voltage at the opening of the trench is increased.

13 Claims, 8 Drawing Sheets

METHOD FOR MANUFACTURING A SEMICONDUCTOR DEVICE HAVING A TRENCH AND A THICK INSULATION FILM AT THE TRENCH OPENING

CROSS REFERENCE TO RELATED APPLICATION

This application is based on and incorporates herein by reference Japanese Patent Application No. 2001-101597 filed on Mar. 30, 2001.

BACKGROUND OF THE INVENTION

The present invention relates to a semiconductor device in which a silicon oxide film is thermally formed on an inner surface of a trench in a semiconductor layer and to a method for manufacturing the device. The present invention is preferably applied to trench-gate type semiconductor devices.

At an end corner of the sidewall of a trench gate, electric-field tends to concentrate, and a gate insulating film tends to be relatively thin, which results in poor breakdown voltage at the corner. As shown in FIG. 9, it has been proposed to alleviate the electric-field concentration and the thinning of the insulating film J1 by rounding the end corner J2. It is also proposed to improve the resistance of the insulating film against electric-field intensity by using a thick silicon oxide film or an ONO film, which consists of a silicon oxide layer, a silicon nitride layer, and another silicon oxide layer, as the insulating film.

However, the above proposed methods have the difficulties mentioned below. In order to round the corner, thermal oxidation, oxide film removal, and isotropic etching need to be repeated, so the sidewall of the trench is etched, and the width of the trench deviates. That causes deviation in the device characteristics. If the thickness of the silicon oxide film is increased, the thickness of the oxide film at a channel region is also increased. That also causes deviation in the device characteristics.

The inventors of the present invention proposed a trench-gate type semiconductor device manufactured by steps shown in FIGS. 10A–10D, in which the ONO film is used. As shown in FIG. 10A, after forming a trench J3, a thermal silicon oxide film J4 is formed on the inner surface of the trench J3. A predetermined thickness of the silicon oxide film J4 in the trench J3 is removed. Then, a silicon nitride film J5 is deposited on the silicon oxide film J4, as shown in FIG. 10B. The silicon nitride film J5 is anisotropically etched to leave the film J5 only on the sidewall of the trench J3, as shown in FIG. 10C. Finally, another silicon oxide film J7 is thermally formed on the silicon nitride film J5 and the silicon oxide films J4. Thus, a thicker silicon oxide film is formed at both upper end corner J6 and lower end corner J8 of the sidewall of the trench J3, as shown in FIG. 10D.

However, the proposed process using the ONO film creates an overhang at the upper corner J6 of the trench J3 after the silicon oxide film J7 is formed, as shown in FIG. 11. The overhang causes a void J10 after a polycrystalline silicon layer J9 for forming a gate electrode is deposited. The void J10 also causes deviation in the device characteristics.

SUMMARY OF THE INVENTION

The present invention has been made in view of the above problems, and an object is to thicken an insulating film at an upper corner of the sidewall of a trench, while the film thickness of a gate insulating film at a channel region and the cross-sectional profile of the trench are controlled.

A surface of a semiconductor substrate is selectively etched to form the opening of a trench. A thick insulating film is deposited on the surface. An inner opening, which is narrower than the trench opening, is formed in the insulating film within the trench opening. The insulating film may be formed using a LOCOS (i.e., local oxidization of silicon) oxide film having so called bird's beak. An inner region of the trench, the width of which is the same as that of the inner opening, is formed by etching using the insulating film as an etching mask. The inner surface of the trench is thermally oxidized to form a silicon oxide film, and the silicon oxide film and the USG film form a gate insulating film. A gate electrode is formed in the trench. In this trench structure, the gate insulating film is relatively thick at its upper corners, so the breakdown voltage at the corners is increased.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
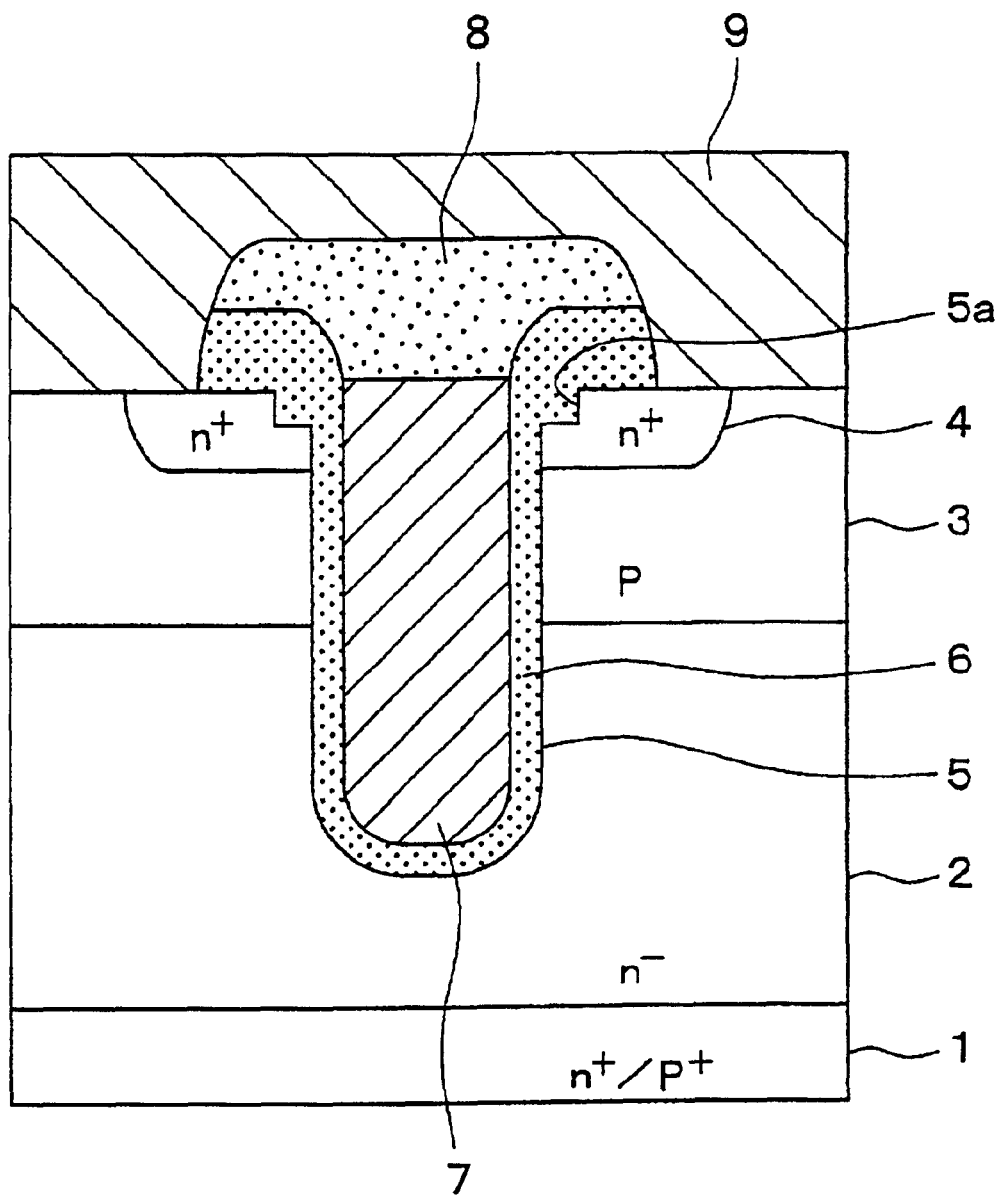
FIG. 1 is a cross-sectional view of a semiconductor device according to a first embodiment of the present invention.

As shown in FIG. 1, a semiconductor device according to a first embodiment includes a transistor having a trench-gate structure applied to a power MOSFET (Metal-Oxide-Silicon Field Effect Transistor) and an IGBT (Insulated Gate Bipolar Transistor). In the transistor, an $n^-$-type drift layer 2 is formed on an $n^+$-type or $p^+$-type silicon substrate 1. On the n⁻-type drift layer 2, a p-type base region 3 is formed. On the p-type base region 3, an n⁺-type source region 4 is formed. The semiconductor device has a trench 5 which extends through the n⁺-type source region 4 and the p-type base region 3 and reaches the n⁻-type drift layer 2.

Trench corners 5a, which are located at upper ends of the sidewalls of the trench 5, are stepped, so the width of the trench 5 is greater at the opening of the trench 5 than at the inner region. To be specific, the trench 5 has a width of about 1 μm at the opening and a width of about 0.6 μm at the inner region. The height of each step is less than the depth of the n⁺-type source region 4, such that the lower end of the steps do not reach a channel region formed in the sidewall of the trench 5.

A gate insulating film 6 made of silicon oxide is formed on the inner surface of the trench 5. The gate insulating film 6 covers the inner surface under the trench corner 5a in a conforming manner. However, the thickness of the gate insulating film 6 at the trench corner 5a is greater than that inside the trench 5 by about the width of the step at the trench corners 5a.

The trench 5, which is lined with the gate insulating film 6, is filled with material to form a gate electrode 7. An interlayer insulating film 8 made of BPSG (boron phosphorus silicate glass) covers the gate electrode 7, the p-type base region 3, and the n⁺-type source region 4. Through a contact hole made in the interlayer insulating film 8, a source electrode 9 is electrically connected to the p-type base region 3 and the n⁺-type source region 4, and a gate and a drain (not illustrated) are respectively connected to electrodes.

With the trench structure described above, the gate insulating film 6 is thick at the trench corners 5a, where electric field tends to concentrate, so the breakdown voltage of the corner 5a is increased. In addition, the gate insulating film 6 covering the inner surface of the trench 5 is not thickened, so deviation in device characteristics is prevented.

Figure 2A:
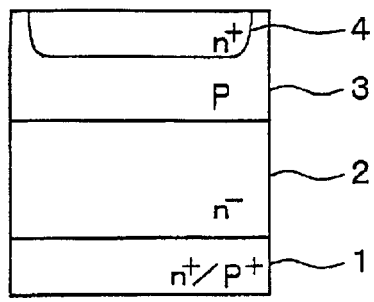
FIGS. 2A to 2G are step-by-step cross-sectional views of a method for manufacturing a semiconductor device according to the first embodiment.
Figure 2B:
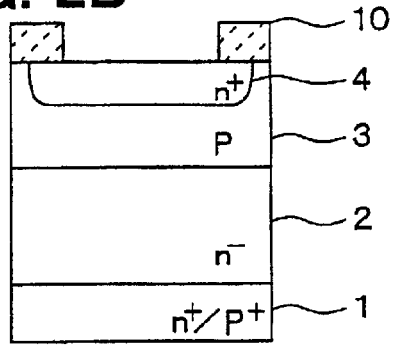
Figure 2C:
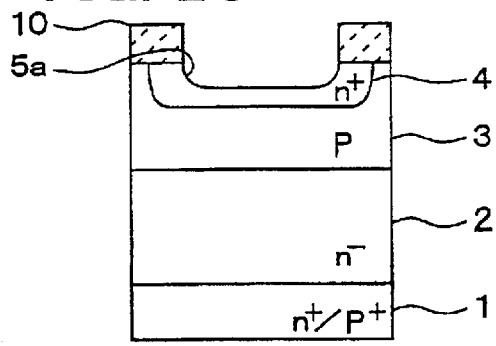

The semiconductor device according to the first embodiment is manufactured by the steps shown in FIGS. 2A to 2G. As shown in FIG. 2A, the n-type drift layer 2 is formed on the n⁺-type or p⁺-type silicon substrate 1. Then, the p-type base region 3, the thickness of which is in the range 2–3 μm, and the n⁺-type source region 4, the thickness of which is 0.5 μm, are formed on the n⁻-type drift layer 2 using ion implantation and thermal diffusion. A photoresist film 10, which is a masking material, is deposited on the substrate 1. Using photolithography, an opening (first opening) is formed in the photoresist film 10, as shown in FIG. 2B. Afterward, the trench corners 5a are formed by anisotropic etching of the substrate 1 through the mask of the photoresist film 10, as shown in FIG. 2C. After the photoresist film 10 is removed with O₂ ashing, H₂SO₄, and H₂O₂, the trench corner 5a is smoothed, or rounded, and damage caused by the etching is cured using sacrificial oxidization and sacrificial oxide removal on a case-by-case basis. The result is a concavity as shown in FIG. 2C.

Figure 2D:
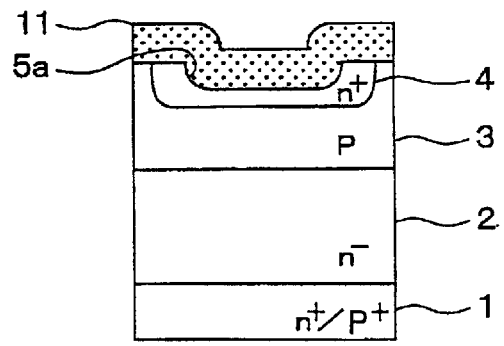
Figure 2E:
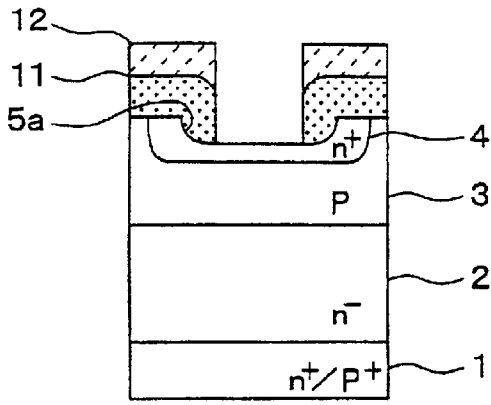
Figure 2F:
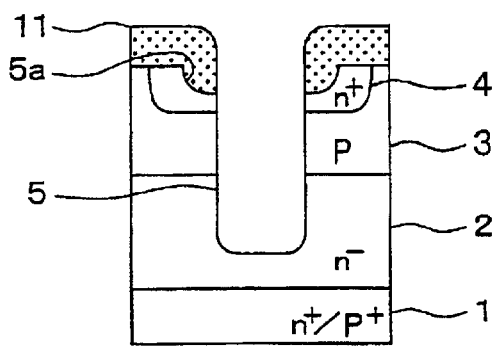

As shown in FIG. 2D, a USG (undoped silicate glass) film 11, the thickness of which is about 0.6 μm, is deposited on the substrate 1 after the substrate 1 is oxidized to form an oxide layer having a thickness of approximately 0.1 μm. Then, the USG film 11 is annealed. Note that the insulating layer formed by the USG film 11 occupies the concavity, as shown in FIG. 2D. A photoresist film 12 is deposited on the USG film 11 and defined using photolithography. Afterward, the USG film 11 is defined by anisotropic etching using the defined photoresist film 12 as a mask to form an opening (second opening) in the USG film 11, as shown in FIG. 2E. The second opening is narrower than the first opening. After the photoresist film 12 is removed with O₂ ashing, H₂SO₄, and H₂O₂, the inner region of the trench 5 is formed by anisotropic etching using the defined USG film 11 as a mask, as shown in FIG. 2F. The trench 5 is 2 μm deep. Then, residual material deposited during etching is removed on a case-by-case basis. Afterward, both the trench corners 5a and the lower end corners of the trench 5 are smoothed, or rounded, and damage due to the etching is cured using chemical dry etching, sacrificial oxidization, and sacrificial oxide removal.

Figure 2G:
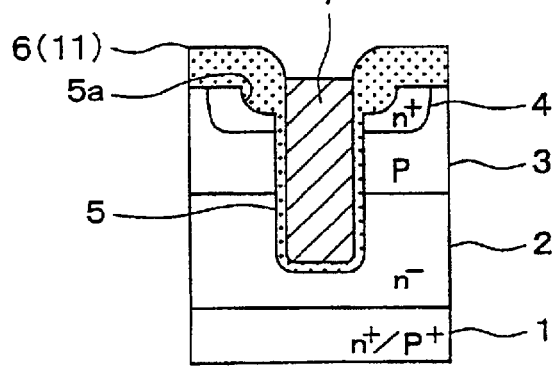

As shown in FIG. 2G, a silicon oxide film, which is the second insulating film, is formed by thermal oxidization (gate oxidization). The silicon oxide film and the USG film 11 constitute the gate insulating film 6, so the thickness of the gate insulating film 6 at the trench corner 5a is larger than that at locations beneath the trench corner 5a by about the width of the step formed at the corner 5a, as shown. A doped polycrystalline silicon film is deposited to fill the trench 5 lined with the silicon oxide film. Then, the doped polycrystalline silicon film is etched back to form the gate electrode 7. Although not illustrated, the formation of the gate electrode 7 is followed by formations of the interlayer insulating film 8, the contact hole extending through the film 8, the source electrode 10, and so on to complete the semiconductor device shown in FIG. 1.

When the silicon oxide film is formed by thermal oxidization, the thermal oxide growth rate at the trench corner 5a is suppressed by the thick USG film 11. Therefore, an overhang profile at the trench corners 5a does not appear after forming the silicon oxide film, and the trench 5 is filled with the doped polycrystalline silicon film without generating a void in the trench 5. Thus, deviation in device characteristics caused by the void is prevented. In addition, the thickness of the gate insulating film 6 at the trench corner 5a is substantially determined by the width of the step formed at the trench corner 5a, so the breakdown voltage at the trench corner 5a is arbitrarily set on the basis of the width of the step.

Figure 3A:
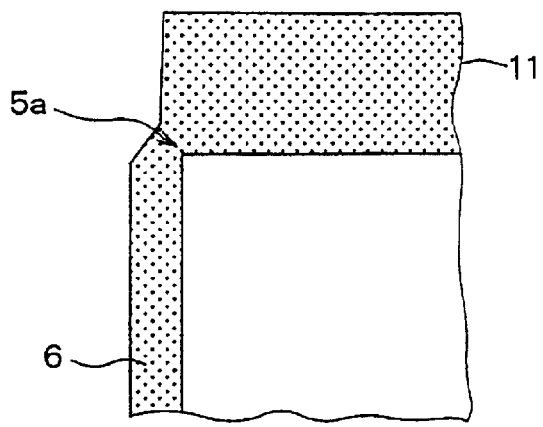
FIGS. 3A and 3B are cross-sectional views illustrating the effect of a step formed at an upper end corner of a trench.
Figure 3B:
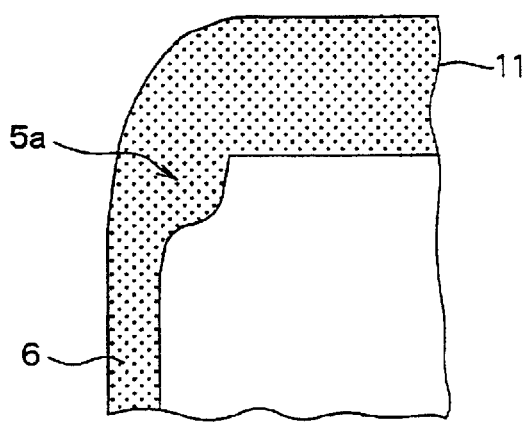

If the trench corner 5a has no step and is sharp as shown in FIG. 3A, the gate insulating film 6 will be thinner at the trench corner 5a than at the inner surface of the trench 5. In this embodiment, the gate insulating film 6 is not thinner at the trench corners 5a as a result of the formation of the steps and the smoothing of the step edges, as shown in FIG. 3B. That is, the gate insulating film 6 is thicker as a result of the concavity, as shown in FIG. 3B.

Second Embodiment

Figure 4A:
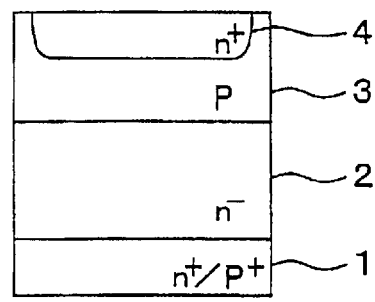
FIGS. 4A to 4D are step-by-step cross-sectional views of a method for manufacturing the semiconductor device according to the second embodiment.
Figure 4B:
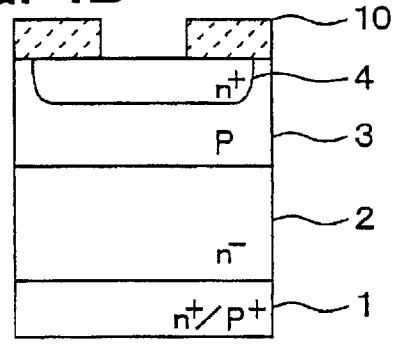
Figure 4C:
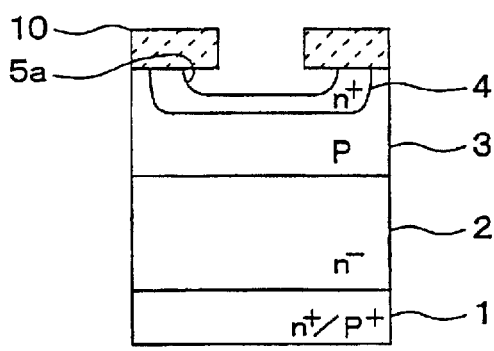
Figure 4D:
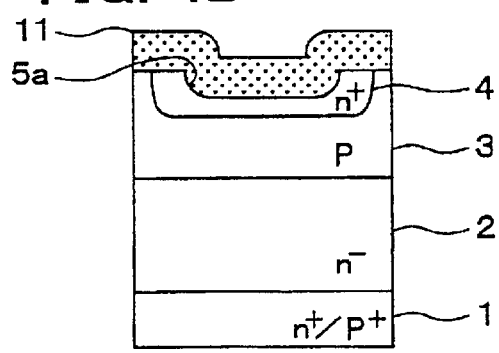

As shown in FIG. 4A, the n⁻-type drift layer 2 is deposited on the n⁺-type or p⁺-type silicon substrate 1. Then, the p-type base region 3 and the n⁺-type source region 4 are formed in the n⁻-type drift layer 2 using the process conditions of FIG. 2A of the first embodiment. Then, the photoresist film 10 is deposited on the substrate 1 and defined using photolithography to form an opening in the photoresist film 10, as shown in FIG. 4B. The opening is narrower than that of the first embodiment. Afterward, the trench corner 5a is formed by isotropic etching of the substrate 1 while masked by the defined photoresist film 10, as shown in FIG. 4C. Note that the etching forms a concavity as shown in FIG. 4G. After removing the photoresist film 10, the USG film 11 is deposited on the substrate 1 in the manner of the first embodiment, as shown in FIG. 4D. The insulating layer formed by the USG film 11 occupies the concavity, as shown in FIG. 4D. Afterward, the steps of FIGS. 2E to 2G of the first embodiment are applied to the substrate 1 to form the semiconductor device shown in FIG. 1. In this embodiment, the step is formed at the trench corner 5a using isotropic etching.

Third Embodiment

Figure 5A:
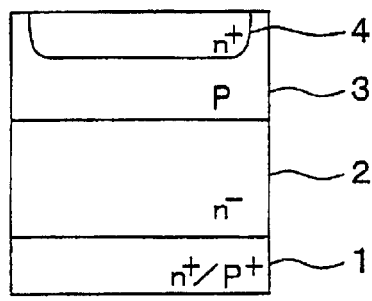
FIGS. 5A to 5F are step-by-step cross-sectional views of a method for manufacturing the semiconductor device according to the third embodiment.
Figure 5B:
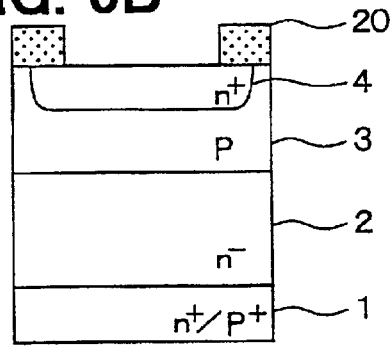
Figure 5C:
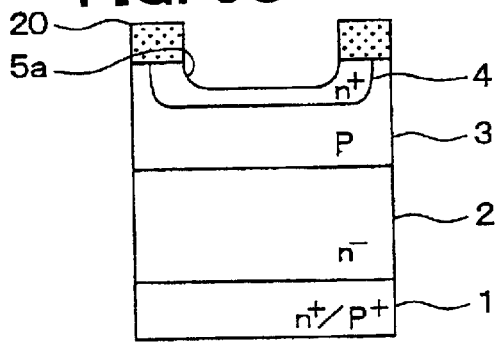
Figure 5D:
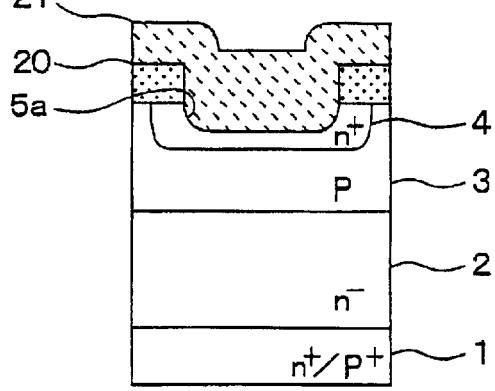
Figure 5E:
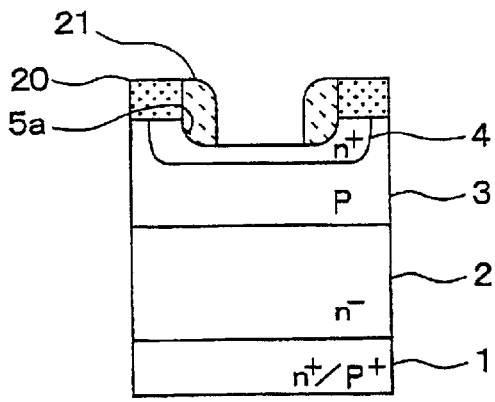

As shown in FIG. 5A, the n⁻-type drift layer 2 is deposited on the n⁺-type or p⁺-type silicon substrate 1. Then, the p-type base region 3 and the n⁺-type source region 4 are formed on the n⁻-type drift layer 2 in the manner of FIG. 2A of the first embodiment. Then, a silicon oxide film 20, which is the first insulating layer, is deposited on the substrate 1. The silicon oxide film 20 is patterned using the photoresist 10 to form an opening in the silicon oxide film 20, as shown in FIG. 5B. The trench corners 5a are formed using the silicon oxide film 20 as an etching mask, as shown in FIG. 5C. Note that the etching forms a concavity as shown in FIG. 5C. Afterward, a silicon oxide film 21, which is the second insulating layer, is deposited on the substrate 1 to cover the trench corners 5a and the silicon oxide film 20, as shown in FIG. 5D. The insulating layer formed by the silicon oxide film 21 occupies the concavity, as shown in FIG. 5D. As shown in FIG. 5E, the silicon oxide film 21 is etched back to remove the film 21 except at the trench corners 5a and the sidewalls of the silicon oxide film 20. The silicon oxide film 21 has a predetermined thickness at the trench corners 5a and the sidewalls of the silicon oxide film 20.

Figure 5F:
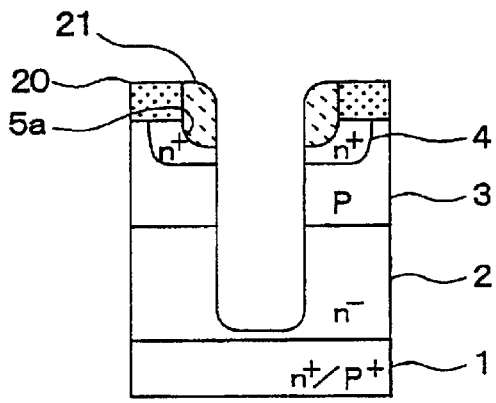

Subsequently, without using photolithography, the substrate 1 is etched to form the inner region of the trench 5 using the silicon oxide films 20 and 21 as an etching mask, as shown in FIG. 5F. In this etching, the position of the inner region in the opening of the trench 5 is automatically determined because the position is determined by the thickness of the silicon oxide film 21 at the trench corners 5a and the sidewalls of the silicon oxide film 20. Then, a silicon oxide film, which is a third insulating film, is formed by thermal oxidization (gate oxidization) in the manner of FIG. 2G. This forms the gate insulating film 6. Afterward, other processes such as the formation of the gate electrode 7 are applied to the substrate 1 to form the completed semiconductor device shown in FIG. 1.

In this embodiment, alignment between the opening and the inner region of trench 5 is automatically done, so it is possible to avoid mask alignment deviation, which might occur in photolithography.

Fourth Embodiment

Figure 6A:
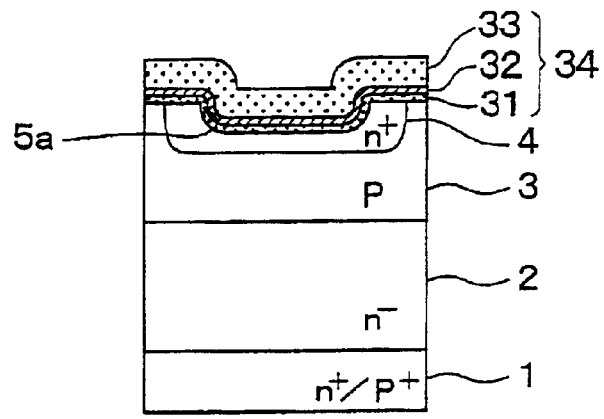
FIGS. 6A to 6C are step-by-step cross-sectional views of a method for manufacturing the semiconductor device according to the fourth embodiment.
Figure 6B:
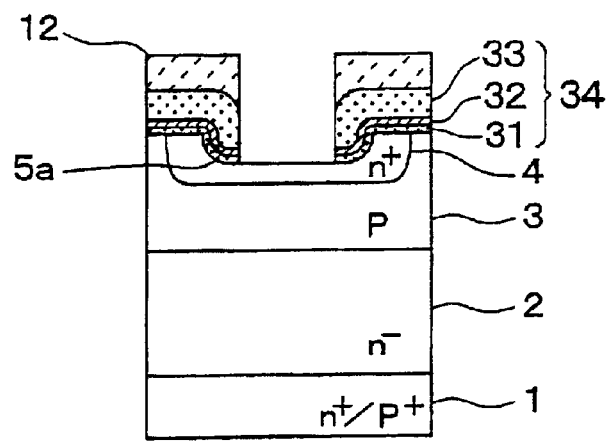
Figure 6C:
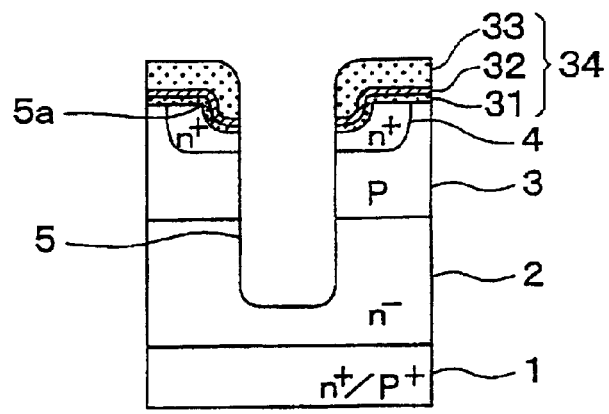

In a fourth embodiment, the gate insulating film 6 is made of an ONO film 34. Using the steps of FIGS. 2A to 2C according to the first embodiment, the trench corners 5a are formed. That is, a concavity is formed, as shown in FIG. 6A. Then, as shown in FIG. 6A, the ONO film 34, which includes a silicon oxide layer 31, a silicon nitride layer 32, and another silicon oxide layer 33, is formed on the substrate 1. Thus, the ONO film 34 occupies the concavity, as shown in FIG. 6A. In the manner of FIG. 2E, the ONO film 34 is defined to form an opening in the ONO film 34, as shown in FIG. 6B. Subsequently, in the manner of FIG. 2F, the trench 5 is formed, as shown in FIG. 6C. Afterward, using the process of FIG. 2G, the gate insulating film 6 is formed by thermal oxidization, and the gate electrode 7 is formed. Other subsequent steps described above are applied to the substrate 1 to form the completed semiconductor device shown in FIG. 1.

Fifth Embodiment

Figure 7A:
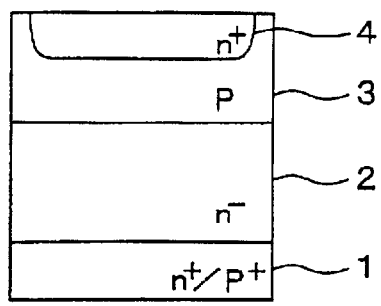
FIGS. 7A to 7F are step-by-step cross-sectional views of a method for manufacturing the semiconductor device according to the fifth embodiment.

In a fifth embodiment, the trench corner 5a is made of a so-called bird's beak of LOCOS oxide film 42. As shown in FIG. 7A, the if-type drift layer 2 is deposited on the n⁺-type or p⁺-type silicon substrate 1. Then, the p-type base region 3 and the n⁺-type source region 4 are formed in the n⁻-type drift layer 2 in the manner of FIG. 2A according to the first embodiment. Then, a silicon nitride film 41 is deposited and defined using photolithography to form an opening in the silicon nitride film 41, as shown in FIG. 7B. Afterward, a thick LOCOS oxide film 42 is formed on the n⁺-type source region 4 at the opening of the silicon nitride film 41 by thermal oxidization (LOCOS oxidization), as shown in FIG. 7G. The trench corner 5a is formed by the so-called bird's beak of the LOCOS oxide film 42. As shown in FIG. 7C, the LOCOS oxide film 42 creates and occupies a concavity in the source region 4.

Figure 7D:
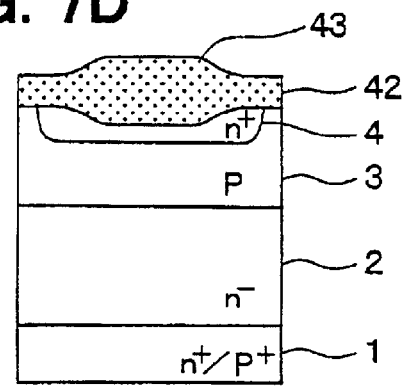
Figure 7B:
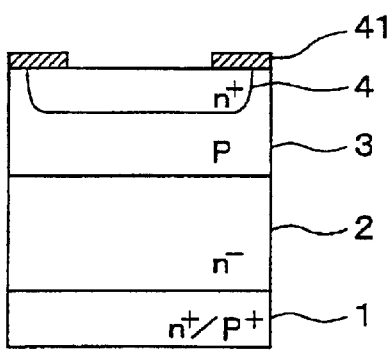
Figure 7E:
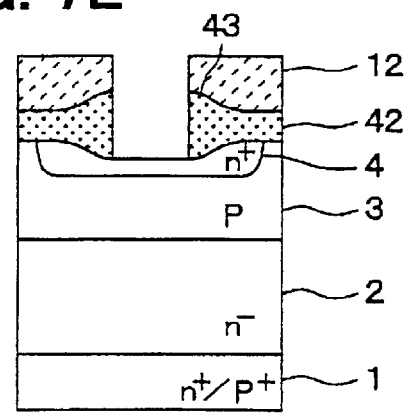
Figure 7C:
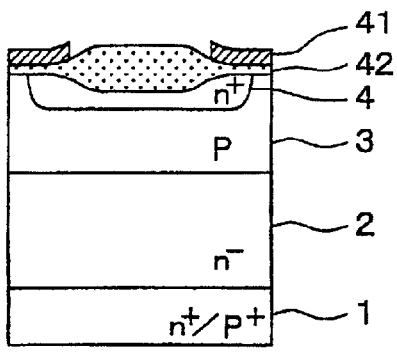
Figure 7F:
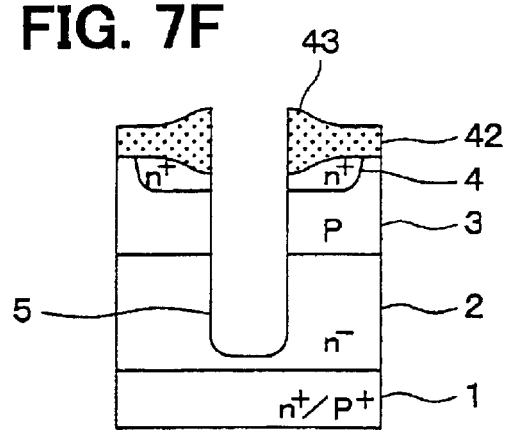

As shown in FIG. 7D, a USG film 43 is deposited on the LOCOS oxide film 42. In the manner of FIG. 2E, the USG film 43 and the LOCOS oxide film 42 are patterned to form an opening, as shown in FIG. 7E. Subsequently, using the process of FIG. 2F, the inner region of the trench 5 is formed, as shown in FIG. 7F. Afterward, in the manner of FIG. 2G, the gate insulating film 6 is formed by thermal oxidization, and the gate electrode 7 is formed. Other subsequent processes, which are described above, are applied to the substrate 1 to make the completed semiconductor device shown in FIG. 1.

Other Embodiments

In the above embodiments, the gate insulating film 6 is a silicon oxide film. However, in this embodiment, the present invention is applied to the proposed trench-gate-type semiconductor device shown in FIG. 11, in which the ONO film is formed on the inner surface of the trench 5. After the gate oxidization shown in FIG. 2G of the first embodiment is completed, the processes shown in FIGS. 10A to 10D and other subsequent steps described above are applied to the substrate 1 to complete the semiconductor device.

Figure 11:
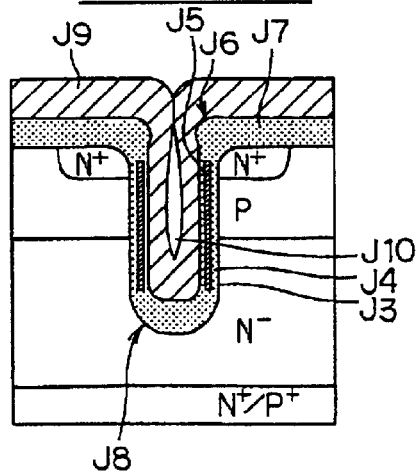
FIG. 11 is a cross-sectional view of a trench having a void resulting from the method of FIGS. 10A to 10D.
Figure 10D:
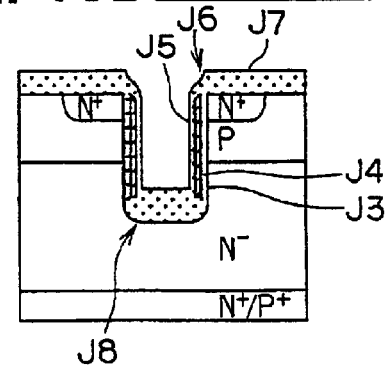

In the proposed device shown in FIG. 11, the silicon nitride film is formed only on the sidewall of the trench 5, so when the gate insulating film 6 of silicon oxide is formed by thermal oxidization, the thermal oxide growth rate in the region that has no silicon nitride film is so high that the thickness of the gate insulating film 6 in the region deviates. That causes deviation of the threshold voltage Vth. However, in this embodiment, the thermal oxide growth at the trench corner 5a is suppressed due to the thick USG film 11 formed at the trench corner 5a in advance. Therefore, the Vth deviation due to the thick gate insulating film 6 is suppressed.

Figure 8A:
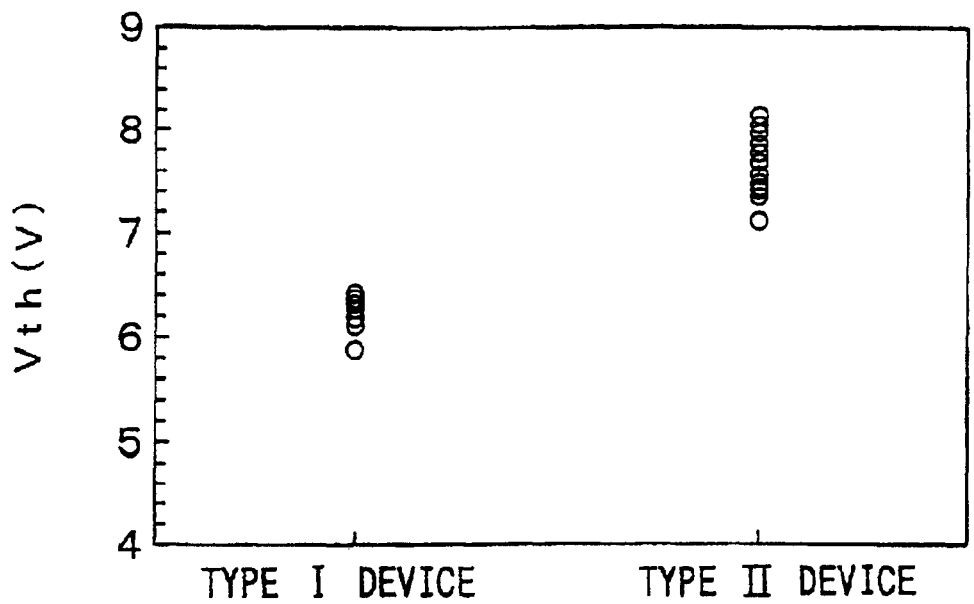
FIG. 8A is a graph showing the Vth deviation of a trench gate without a step at an upper end corner of the trench gate.
Figure 8B:
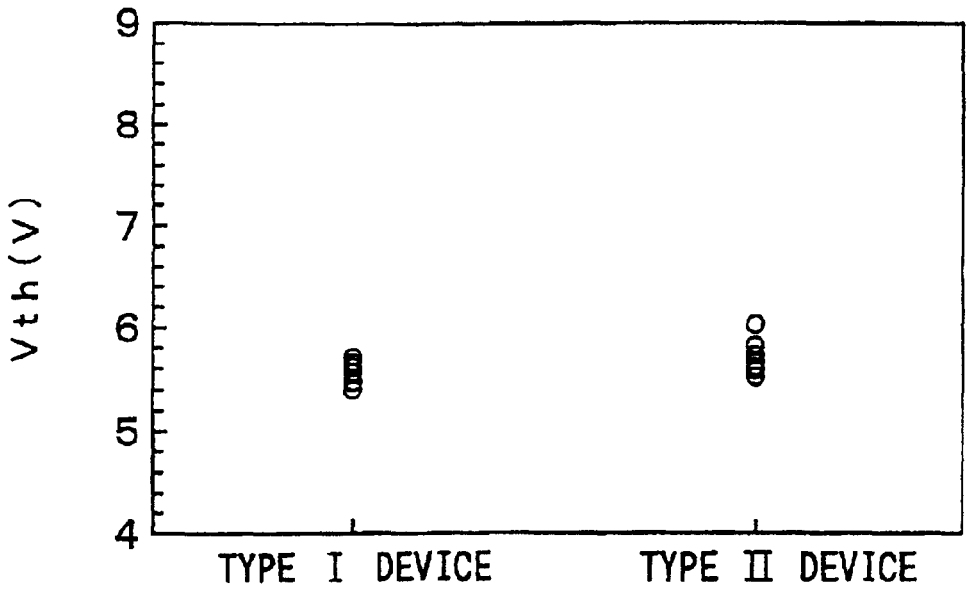
FIG. 8B is a graph showing the Vth deviation of a trench gate with a step at an upper end corner of the trench gate.
Figure 9:
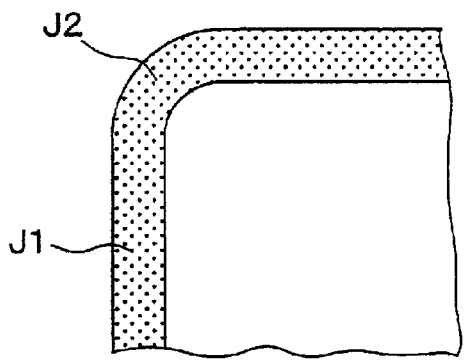
FIG. 9 is a cross-sectional view of a rounded upper end corner of a conventional trench.
Figure 10A:
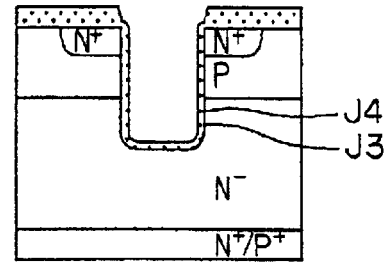
FIGS. 10A to 10D are step-by-step cross-sectional views of a method for manufacturing the semiconductor device that was formerly proposed by the inventors of the present invention.
Figure 10B:
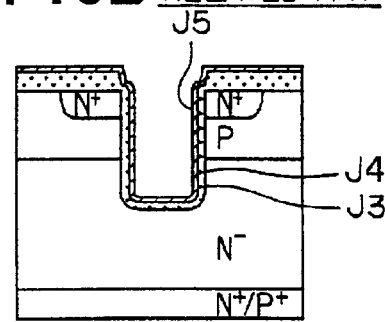
Figure 10C:
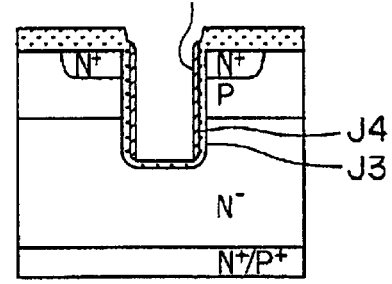

The Vth deviation is shown in FIGS. 8A and 8B. In those figures, type I and type II devices are distinguished. In a type I device, the silicon nitride film in the ONO film is formed to extend along the entire extent of the gate insulating film 6. Therefore, the silicon nitride film extends along both the sidewalls and the bottom of the trench. In a type II device, the silicon nitride film is formed only on the sidewalls of the trench 5. As shown in FIG. 8A, in a device that lacks the stepped trench corners 5a, the Vth deviation in the type II device is much larger than that in the type I device. As shown in FIG. 8B, in a device having the stepped trench corners 5a, the Vth deviations of the type I and II devices are not significantly different.

In the first and the second embodiments, the photoresist 10 is used as an etching mask to form the trench corner 5a. However, instead of the photoresist 10, a silicon oxide film may be used as the etching mask.

In the embodiments that employ an ONO film for the gate insulating film, the silicon nitride layer may be formed along the entire extent of the silicon oxide film or only on the sidewalls of the trench. That is, the invention applies to both type I and type II devices.

What is claimed is:

1. A method for manufacturing a semiconductor device, wherein the device includes a trench formed on a substrate, the inner surface of which is covered with an insulating film, the method comprising:

masking a surface of the substrate with a masking material;

forming a first opening, which is for the opening of the trench, by etching the surface of the substrate through the masking material, wherein the first opening is a concavity in the substrate;

covering the first opening with a first insulating layer after removing the masking material;

forming a second opening, which is narrower than the first opening, in the first insulating layer within the first opening;

forming an inner section of the trench, such that the width of the inner section is less than the width of the first opening, by etching the surface of the substrate on which the first insulating layer is located, wherein the first insulating layer serves as a mask in forming the inner section of the trench; and forming a second insulating layer on the inner surface of the trench, wherein the second insulating layer joins with the first insulating layer to form the insulating film, wherein the insulating film has a thin portion originating from the second insulating layer and a thick portion originating from the first insulating layer.

2. The method of claim 1, wherein the first opening is formed by anisotropic etching.

3. The method of claim 1, wherein the first opening is formed by isotropic etching.

4. The method of claim 1, wherein the first insulating layer is formed by forming an ONO film, which includes a silicon oxide layer, a silicon nitride layer, and another silicon oxide layer.

5. The method of claim 1, wherein the second insulating layer is formed by applying an ONO film, which is made of a silicon oxide layer, a silicon nitride layer, and another silicon oxide layer.

6. The method of claim 1, further comprising:

forming a conductive drift region of a first conductivity type in the semiconductor substrate;

forming a conductive base region of a second conductivity type on the drift region;

forming a conductive source region of the first conductivity type on the base region, wherein the trench extends through the source region and the base region and reaches the drift region; and filling the trench with a gate electrode after the inner surface of the trench is covered with the insulating film.

7. A method for manufacturing a semiconductor device, wherein the device includes a trench formed on a substrate, the inner surface of which is covered with an insulating film, the method comprising:

forming a first insulating layer on the substrate, wherein a mask opening is formed in the first insulating layer;

forming a first opening, which is for the opening of the trench, by etching a surface of the substrate on which the insulating layer is formed through the mask opening such that the insulating layer serves as a mask, wherein the first opening is a concavity in the substrate;

covering the first opening and the first insulating layer with a second insulating layer;

forming a second opening, which is narrower than the first opening, in the first insulating layer within the first opening by etching back the second insulating layer;

forming an inner section of the trench, such that the width of the inner section is less than the width of the first opening, by etching the surface of the substrate, wherein the first insulating layer and the second insulating layer serve as a masks in forming the inner section of the trench; and forming a third insulating layer on the inner surface of the trench, wherein the third insulating layer joins with the first insulating layer and the second insulating layer to form an insulating film, wherein the insulating film has a thin portion originating from the third insulating layer and a thick portion originating from the second insulating layer.

8. The method of claim 7, wherein the third insulating layer is formed by applying an ONO film, which is made of a silicon oxide layer, a silicon nitride layer, and another silicon oxide layer.

9. The method of claim 7, the method further comprising:

forming a conductive drift region of a first conductivity type in the semiconductor substrate;

forming a conductive base region of a second conductivity type on the drift region;

forming a conductive source region of the first conductivity type on the base region, wherein the trench extends through the source region and the base region and reaches the drift region; and filling the trench with a gate electrode after the inner surface of the trench is covered with the insulating film.

10. The method of claim 6, wherein the method further comprises forming the gate electrode such that an upper portion of the gate electrode extends above a bottom of the first opening.

11. The method of claim 6, wherein the method further comprises forming the first and the second insulation layers such that the insulating film is continuous and uninterrupted.

12. The method of claim 7, wherein the method includes leaving the second insulation layer in place as a permanent layer that is part of the semiconductor device.

13. The method of claim 1, wherein the method further comprise:

forming a transistor source layer in the substrate before the masking of the substrate with the masking material; and forming the inner section of the trench such that the opening of the trench is located in the transistor source layer.

* * * * *

UNITED STATES PATENT AND TRADEMARK OFFICE
CERTIFICATE OF CORRECTION

PATENT NO.     : 6,797,588 B2
DATED          : September 28, 2004
INVENTOR(S)    : Eiji Ishikawa, Takaaki Aoki and Kenji Kondo It is certified that error appears in the above-identified patent and that said Letters Patent is hereby corrected as shown below:

<u>Title page,</u>
Item [75], Inventor, third inventor should read -- Kenji Kondo, Hoi-gun --.
Item [73], Assignee, should read -- Denso Corporation, Kariya (JP) --.

Signed and Sealed this

Sixteenth Day of August, 2005

JON W. DUDAS
*Director of the United States Patent and Trademark Office*